(12) United States Patent
Nishimoto et al.

(10) Patent No.: US 10,734,297 B2
(45) Date of Patent: Aug. 4, 2020

(54) AG UNDERLAYER-ATTACHED METALLIC MEMBER, AG UNDERLAYER-ATTACHED INSULATING CIRCUIT SUBSTRATE, SEMICONDUCTOR DEVICE, HEAT SINK-ATTACHED INSULATING CIRCUIT SUBSTRATE, AND METHOD FOR MANUFACTURING AG UNDERLAYER-ATTACHED METALLIC MEMBER

(71) Applicant: MITSUBISHI MATERIALS CORPORATION, Tokyo (JP)

(72) Inventors: Shuji Nishimoto, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/072,660

(22) PCT Filed: Jan. 26, 2017

(86) PCT No.: PCT/JP2017/002678
§ 371 (c)(1),
(2) Date: Sep. 11, 2018

(87) PCT Pub. No.: WO2017/135139
PCT Pub. Date: Aug. 10, 2017

(65) Prior Publication Data
US 2019/0035703 A1     Jan. 31, 2019

(30) Foreign Application Priority Data
Feb. 1, 2016  (JP) .................................. 2016-017304

(51) Int. Cl.
*H05K 1/02* (2006.01)
*H05K 1/18* (2006.01)
(Continued)

(52) U.S. Cl.
CPC ........ *H01L 23/142* (2013.01); *H01L 21/4867* (2013.01); *H01L 23/08* (2013.01);
(Continued)

(58) Field of Classification Search
CPC ... H01L 23/142; H01L 24/73; H01L 23/3735; H01L 23/15; H01L 23/147; H01L 23/08;
(Continued)

(56) References Cited

U.S. PATENT DOCUMENTS

2002/0197488 A1*  12/2002  Tanei .................. H01L 21/4867
                                                                         428/432
2011/0012262 A1*  1/2011  Morita .................... H01L 24/29
                                                                         257/741
(Continued)

FOREIGN PATENT DOCUMENTS

JP        07-066315 A       3/1995
JP        2004-172378 A     6/2004
(Continued)

OTHER PUBLICATIONS

International Search Report dated Mar. 7, 2017, issued for PCT/JP2017/002678 and English translation thereof.
(Continued)

*Primary Examiner* — Ishwarbhai B Patel
(74) *Attorney, Agent, or Firm* — Locke Lord LLP

(57) ABSTRACT

An Ag underlayer-attached metallic member includes a metallic member joined with a body to be joined and an Ag underlayer formed on a joining surface of the metallic member with the body to be joined, the Ag underlayer includes a glass layer formed on a metallic member side and an Ag layer laminated on the glass layer, and an area proportion of voids in an Ag layer surface of the Ag underlayer is 25% or less.

6 Claims, 10 Drawing Sheets

(51) Int. Cl.
  H05K 3/30      (2006.01)
  H01L 23/14     (2006.01)
  H01L 21/48     (2006.01)
  H01L 23/00     (2006.01)
  H01L 23/488    (2006.01)
  H01L 23/40     (2006.01)
  H01L 23/08     (2006.01)
  H01L 23/15     (2006.01)
  H01L 23/373    (2006.01)
  H01L 23/473    (2006.01)
  H05K 1/03      (2006.01)

(52) U.S. Cl.
  CPC ............ *H01L 23/147* (2013.01); *H01L 23/15* (2013.01); *H01L 23/3735* (2013.01); *H01L 23/40* (2013.01); *H01L 23/488* (2013.01); *H01L 24/27* (2013.01); *H01L 24/29* (2013.01); *H01L 24/32* (2013.01); *H01L 24/48* (2013.01); *H01L 24/73* (2013.01); *H01L 24/83* (2013.01); *H05K 1/0203* (2013.01); *H05K 1/181* (2013.01); *H01L 23/473* (2013.01); *H01L 2224/039* (2013.01); *H01L 2224/03505* (2013.01); *H01L 2224/03848* (2013.01); *H01L 2224/03901* (2013.01); *H01L 2224/279* (2013.01); *H01L 2224/2732* (2013.01); *H01L 2224/2744* (2013.01); *H01L 2224/27505* (2013.01); *H01L 2224/27515* (2013.01); *H01L 2224/27618* (2013.01); *H01L 2224/27848* (2013.01); *H01L 2224/27901* (2013.01); *H01L 2224/2939* (2013.01); *H01L 2224/29083* (2013.01); *H01L 2224/29294* (2013.01); *H01L 2224/29339* (2013.01); *H01L 2224/29386* (2013.01); *H01L 2224/29387* (2013.01); *H01L 2224/29388* (2013.01); *H01L 2224/32227* (2013.01); *H01L 2224/4809* (2013.01); *H01L 2224/48091* (2013.01); *H01L 2224/48227* (2013.01); *H01L 2224/73265* (2013.01); *H01L 2224/83075* (2013.01); *H01L 2224/8384* (2013.01); *H01L 2224/83192* (2013.01); *H01L 2224/83203* (2013.01); *H01L 2224/83424* (2013.01); *H01L 2224/83439* (2013.01); *H01L 2224/83447* (2013.01); *H01L 2224/83487* (2013.01); *H01L 2924/00014* (2013.01); *H01L 2924/12041* (2013.01); *H01L 2924/181* (2013.01); *H01L 2924/3512* (2013.01); *H05K 1/0306* (2013.01)

(58) Field of Classification Search
  CPC ......... H01L 23/36; H01L 23/14; H01L 23/12; H01L 23/40; H01L 2924/181; H01L 2224/73265; H05K 1/0201; H05K 1/0203; H05K 1/03; H05K 1/0306; H05K 1/05; H05K 1/053; H05K 1/092; H05K 1/097; H05K 1/119; H05K 1/18; H05K 1/181
  See application file for complete search history.

(56) References Cited

U.S. PATENT DOCUMENTS

2015/0255419 A1\* 9/2015 Nishimoto ............... H01L 24/32
                                                 257/773
2016/0219693 A1\* 7/2016 Nishimoto .......... H01L 23/3735
2016/0293562 A1\* 10/2016 Nishimoto .......... H01L 23/3735

FOREIGN PATENT DOCUMENTS

| JP | 2006-202938 | A |   | 8/2006 |
|----|-------------|---|---|--------|
| JP | 2008-208442 | A |   | 9/2008 |
| JP | 2009-267374 | A |   | 11/2009 |
| JP | 2013-012706 | A |   | 1/2013 |
| JP | 2013-202648 | A |   | 10/2013 |
| JP | 02013207116 | A | \* | 10/2013 |
| JP | 2014-127629 | A |   | 7/2014 |
| WO | 2009/150741 | A1 |   | 12/2009 |

OTHER PUBLICATIONS

Supplementary European Search Report dated Jul. 3, 2019, issued for the European patent application No. 17747297.4.

\* cited by examiner

AG UNDERLAYER-ATTACHED METALLIC MEMBER, AG UNDERLAYER-ATTACHED INSULATING CIRCUIT SUBSTRATE, SEMICONDUCTOR DEVICE, HEAT SINK-ATTACHED INSULATING CIRCUIT SUBSTRATE, AND METHOD FOR MANUFACTURING AG UNDERLAYER-ATTACHED METALLIC MEMBER

TECHNICAL FIELD

The present invention relates to an Ag underlayer-attached metallic member including a metallic member joined to a body to be joined and an Ag underlayer formed on a surface of the metallic member, an Ag underlayer-attached insulating circuit substrate having this Ag underlayer-attached metallic member, a semiconductor device including this Ag underlayer-attached insulating circuit substrate, a heat sink-attached insulating circuit substrate, and a method for manufacturing an Ag underlayer-attached metallic member.

Priority is claimed on Japanese Patent Application No. 2016-017304, filed on Feb. 1, 2016, the content of which is incorporated herein by reference.

BACKGROUND ART

Semiconductor devices such as an LED or a power module have a structure in which a semiconductor element is joined onto a circuit layer formed of a conductive material.

In a power semiconductor element for high-power control which is used to control wind force power generation, electric vehicles, hybrid vehicles, and the like, the amount of heat generated is great, and thus, as a substrate mounting this power semiconductor element for high powder control, for example, an insulating circuit substrate including an insulating layer formed of a ceramic substrate of aluminum nitride (AlN), alumina ($Al_2O_3$), or the like and a circuit layer formed by disposing a metal having an excellent conductive property on one surface of this insulating layer (a substrate for a powder module) has been broadly used in the related art.

For example, a power module (a semiconductor device) described in Patent Document 1 has a structure in which a substrate for a power module having a circuit layer formed of a metal such as Al or Cu formed on one surface of a ceramic substrate (an insulating circuit substrate) and a semiconductor element that is joined onto this circuit layer are provided.

In addition, a power module including a metallic layer formed by disposing a metal having an excellent thermal conductive property on the other surface of the ceramic substrate is also provided. In addition, the power module has a constitution in which a heat sink is joined to the metallic layer of the substrate for a power module and heat generated in the semiconductor element is transmitted toward the substrate for a power module and diffused to the outside through the heat sink.

When an electronic component such as a semiconductor element is joined to a circuit layer or a heat sink is joined to a metallic layer, for example, a method in which a solder material is used as described in Patent Document 1 is broadly used.

In recent years, from the viewpoint of environmental protection, for example, a lead-free solder such as a Sn—Ag-based solder material, a Sn—In-based solder material, or a Sn—Ag—Cu-based solder material has become mainstream as a solder material used to join an electronic component such as a semiconductor element and a circuit layer or join a heat sink and a metallic layer.

Here, in a circuit layer and a metallic layer formed of aluminum or an aluminum alloy, a natural oxide film of aluminum is formed on the surface, and thus it has been difficult to favorably join the circuit layer and the metallic layer to a semiconductor element and a heat sink using a solder material.

In addition, in a circuit layer or a metallic layer formed of copper or a copper alloy, there has been a concern that a molten solder material and copper may react with each other, a component of the solder material may intrude into the inside of the circuit layer, and the characteristics of the circuit layer and the metallic layer may deteriorate.

Therefore, in the related art, a semiconductor element has been manufactured using a solder material after a Ni-plated film is formed on the surface of a circuit layer and a metallic layer as described in Patent Document 1.

In addition, as described in Patent Document 1, in a case in which a semiconductor element and a heat sink are joined together using a solder material, there is a concern that, when used in a high-temperature environment, some of the solder may melt and the joining reliability among the semiconductor element, the heat sink, and an insulating circuit substrate may degrade.

As a joining method in which no solder material is used, for example, Patent Document 2 proposes a technique for joining an electronic component such as a semiconductor element or a heat sink using an Ag nano-paste.

In addition, for example, Patent Document 3 and 4 propose techniques for joining an electronic component such as a semiconductor element or a heat sink using an oxide paste including metallic oxide particles and a reducing agent formed of an organic substance.

However, as described in Patent Document 2 to 4, in the case of joining an electronic component such as a semiconductor element using a metal paste or an oxide paste without using a solder material, a joint layer formed of a sintered body of this paste is formed to be thinner than the solder material, and thus stress during the loading of a heat cycle is likely to act on the electronic component such as the semiconductor element, and there has been a concern that the electronic component such as the semiconductor element may break. Similarly, when a joint layer formed between a metallic layer and a heat sink becomes thin, heat strain generated due to a difference in thermal expansion coefficient between an insulated circuit substrate and the heat sink acts on the insulated circuit substrate, and there has been a concern that cleavage may be generated in an insulating layer.

Therefore, for example, Patent Document 5 proposes a technique in which an Ag underlayer using a glass-containing Ag paste is formed on a circuit layer formed of aluminum or copper and then the circuit layer and a semiconductor element are joined together through the Ag paste. In this technique, the glass-containing Ag paste is applied and sintered on the surface of the circuit layer formed of aluminum or copper, whereby an oxide coating formed on the surface of the circuit layer is reacted with glass and removed so as to form an Ag underlayer, and the semiconductor element is joined onto the circuit layer on which the Ag underlayer is formed through the Ag joint layer formed of a sintered body of the Ag paste. Here, the Ag underlayer includes a glass layer formed by the reaction between the glass and the oxide coating on the circuit layer and an Ag layer formed on the glass layer. In this glass layer, conductive particles are dispersed, and due to these conductive particles, the conductive property of the glass layer is ensured.

According to the technique described in Patent Document 5, in this case, a sufficient thickness can be ensured by the Ag underlayer and a joint layer formed of the sintered body of the Ag paste and a silver oxide paste, and thus it becomes possible to suppress the breakage of the semiconductor element or the generation of cleavage in the insulating layer.

CITATION LIST

Patent Document

[Patent Document 1] Japanese Unexamined Patent Application, First Publication No. 2004-172378
[Patent Document 2] Japanese Unexamined Patent Application, First Publication No. 2006-202938
[Patent Document 3] Japanese Unexamined Patent Application, First Publication No. 2008-208442
[Patent Document 4] Japanese Unexamined Patent Application, First Publication No. 2009-267374
[Patent Document 5] Japanese Unexamined Patent Application, First Publication No. 2013-012706

DISCLOSURE OF INVENTION

Technical Problem

Recently, compound semiconductor elements such as SiC or GaN, replacing silicon semiconductors, have been expected to be put into practical use, and the improvement of the heat resistance of semiconductor elements is anticipated, and thus the temperature at which semiconductor devices can be used has tended to increase.

Here, in a case in which an Ag underlayer is formed on a circuit layer formed of aluminum or copper by using a glass-containing Ag paste and then a semiconductor element and a heat sink are joined together using the Ag paste and a silver oxide paste as described in Patent Document 5, there is a concern that, for example, when a thermal cycle reaching a high temperature of 200° C. or higher is loaded, cracks may be generated in a joint layer formed of a sintered body of the Ag paste and the silver oxide paste and thus the semiconductor element and the heat sink may be peeled off.

Therefore, there is a demand for an Ag underlayer-attached metallic member capable of suppressing the generation of cracks in a joint layer even in a case in which a thermal cycle reaching a high temperature is loaded.

The present invention has been made in consideration of the above-described circumstances, and an object of the present invention is to provide an Ag underlayer-attached metallic member which is capable of suppressing the generation of cracks in a joint layer even in the case of being used in a relatively high-temperature environment and is excellent in terms of joining reliability between a body to be joined and the metallic member, an Ag underlayer-attached insulating circuit substrate formed of this Ag underlayer-attached metallic member, a semiconductor device and a heat sink-attached insulating circuit substrate for which the Ag underlayer-attached insulating circuit substrate is used, and a method for manufacturing an Ag underlayer-attached metallic member.

Solution to Problem

As a result of intensive studies for achieving the above-described object by solving the above-described problems, the present inventors found that, in the case of joining a body to be joined by forming a joint layer formed of a sintered body of a joining material including either or both of Ag and silver oxide and an organic substance on an Ag underlayer, for example, when a thermal cycle reaching a high temperature of 200° C. or higher is loaded, cracks are generated in the joint layer from voids present on a surface of the Ag underlayer which is in contact with the joint layer as origination points.

The present invention has been made on the basis of the above-described finding, and an Ag underlayer-attached metallic member of the present invention is an Ag underlayer-attached metallic member including a metallic member joined with a body to be joined and an Ag underlayer formed on a joining surface of the metallic member with the body to be joined, in which the Ag underlayer includes a glass layer formed on a metallic member side and an Ag layer laminated on the glass layer, and an area proportion of voids in a surface of the Ag underlayer on a Ag layer side is 25% or less.

In the Ag underlayer-attached metallic member having this constitution, the area proportion of voids in the surface of the Ag underlayer on the Ag layer side is set to 25% or less, and thus, even in the case of joining a body to be joined by forming a joint layer formed of a sintered body of a joining material including either or both of Ag and silver oxide and an organic substance on the Ag underlayer, it is possible to suppress the generation of cracks in the joint layer from voids present on the surface of the Ag underlayer on the Ag layer side as origination points when the Ag underlayer-attached metallic member is used in a high-temperature environment. Therefore, it becomes possible to stably use the Ag underlayer-attached metallic member of the present invention even in a high-temperature environment.

In addition, an Ag underlayer-attached insulating circuit substrate of the present invention is an Ag underlayer-attached insulating circuit substrate including an insulating layer, a circuit layer disposed on one surface of the insulating layer, and an Ag underlayer formed on a surface of the circuit layer opposite to the insulating layer, in which the circuit layer and the Ag underlayer are formed of the Ag underlayer-attached metallic member, and an area proportion of voids in the surface of the Ag underlayer on the Ag layer side is set to 25% or less.

In the Ag underlayer-attached insulating circuit substrate having this constitution, the area proportion of voids in the surface of the Ag underlayer on the Ag layer side is set to 25% or less, and thus, even in the case of joining an electronic component such as a semiconductor element by forming a joint layer formed of a sintered body of a joining material including either or both of Ag and silver oxide and an organic substance on the Ag underlayer, it is possible to suppress the generation of cracks in the joint layer from voids present on the surface of the Ag underlayer on the Ag layer side as origination points when the Ag underlayer-attached insulating circuit substrate is used in a high-temperature environment. Therefore, it is possible to ensure the joining reliability between the circuit layer and the electronic component such as the semiconductor element even in a case in which the Ag underlayer-attached insulating circuit substrate is used in a high-temperature environment.

Furthermore, the Ag underlayer-attached insulating circuit substrate of the present invention is an Ag underlayer-attached insulating circuit substrate including an insulating layer, a circuit layer disposed on one surface of the insulating layer, a metallic layer disposed on the other surface of the insulating layer, and an Ag underlayer formed on a surface of the metallic layer opposite to the insulating layer, in which the circuit layer and the Ag underlayer are formed of the Ag underlayer-attached metallic member, and an area proportion of voids in the surface of the Ag underlayer on the Ag layer side is set to 25% or less.

In the Ag underlayer-attached insulating circuit substrate having this constitution, the area proportion of voids in the surface of the Ag underlayer on the Ag layer side is set to 25% or less, and thus, even in the case of joining a heat sink or the like by forming a joint layer formed of a sintered body of a joining material including either or both of Ag and silver oxide and an organic substance on the Ag underlayer, it is possible to suppress the generation of cracks in the joint layer from voids present on the surface of the Ag underlayer on the Ag layer side as origination points when the Ag underlayer-attached insulating circuit substrate is used in a high-temperature environment. Therefore, it is possible to ensure the joining reliability between the metallic layer and the heat sink even in a case in which the Ag underlayer-attached insulating circuit substrate is used in a high-temperature environment.

In addition, a semiconductor device of the present invention is a semiconductor device including the Ag underlayer-attached insulating circuit substrate and a semiconductor element joined to the Ag underlayer of the circuit layer, in which the semiconductor element and the Ag underlayer are joined together through a joint layer formed of a sintered body of a joining material including either or both of Ag and silver oxide and an organic substance.

According to the semiconductor device having this constitution, the area proportion of voids in the surface of the Ag underlayer on the Ag layer side is set to 25% or less, and thus it is possible to suppress the generation of cracks in the joint layer from voids present on the surface of the Ag underlayer on the Ag layer side as origination points. Therefore, it is possible to ensure the joining reliability between the circuit layer and the semiconductor element even in a case in which the semiconductor device is used in a high-temperature environment.

Furthermore, a heat sink-attached insulating circuit substrate of the present invention is a heat sink-attached insulating circuit substrate including the Ag underlayer-attached insulating circuit substrate and a heat sink joined to the Ag underlayer of the metallic layer, in which the heat sink and the Ag underlayer are joined together through a joint layer formed of a sintered body of a joining material including either or both of Ag and silver oxide and an organic substance.

In the heat sink-attached insulating circuit substrate having this constitution, the area proportion of voids in the surface of the Ag underlayer on the Ag layer side is set to 25% or less, and thus it is possible to suppress the generation of cracks in the joint layer from voids present on the surface of the Ag underlayer on the Ag layer side as origination points. Therefore, it is possible to ensure the joining reliability between the metallic layer and the heat sink even in a case in which the heat sink-attached insulating circuit substrate is used in a high-temperature environment.

In addition, a method for manufacturing an Ag underlayer-attached metallic member of the present invention is a method for manufacturing the underlayer-attached metallic member, the method including a glass-containing Ag paste application step of applying glass-containing Ag paste containing a glass component to a joining surface of the metallic member to which the body to be joined is joined, a first drying step of drying the applied glass-containing Ag paste, an Ag paste application step of applying Ag paste onto the dried glass-containing Ag paste, a second drying step of drying the applied Ag paste, and a sintering step of sintering the dried glass-containing Ag paste and the dried Ag paste, thereby forming an Ag underlayer having a glass layer and an Ag layer and setting an area proportion of voids in an surface of the Ag underlayer on an Ag layer side to 25% or less.

According to the method for manufacturing an Ag underlayer-attached metallic member having this constitution, the glass-containing Ag paste is applied and dried on the metallic member, then, the Ag paste is applied and dried on the applied and dried glass-containing Ag paste, and then sintering is carried out, and thus the glass layer is formed on the metallic member side, the Ag layer is formed on the glass layer, voids attributed to glass are not generated in the surface of the Ag layer, and the area proportion of voids in the surface of the Ag layer can be set to 25% or less.

Advantageous Effects of Invention

According to the present invention, it becomes possible to provide an Ag underlayer-attached metallic member which is capable of suppressing the generation of cracks in a joint layer even in the case of being used in a relatively high-temperature environment and is excellent in terms of joining reliability between a body to be joined and the metallic member, an Ag underlayer-attached insulating circuit substrate formed of this Ag underlayer-attached metallic member, a semiconductor device and a heat sink-attached insulating circuit substrate for which the Ag underlayer-attached insulating circuit substrate is used, and a method for manufacturing an Ag underlayer-attached metallic member.

BEST MODE FOR CARRYING OUT THE INVENTION

Hereinafter, embodiments of the present invention will be described with reference to the accompanying drawings.

First Embodiment

First, a first embodiment of the present invention will be described. A semiconductor device of the present embodiment is a power module in which a power semiconductor element for high-power control which is used to control wind force power generation, electric wheeled vehicles such as electric vehicles, and the like.

Figure 1:
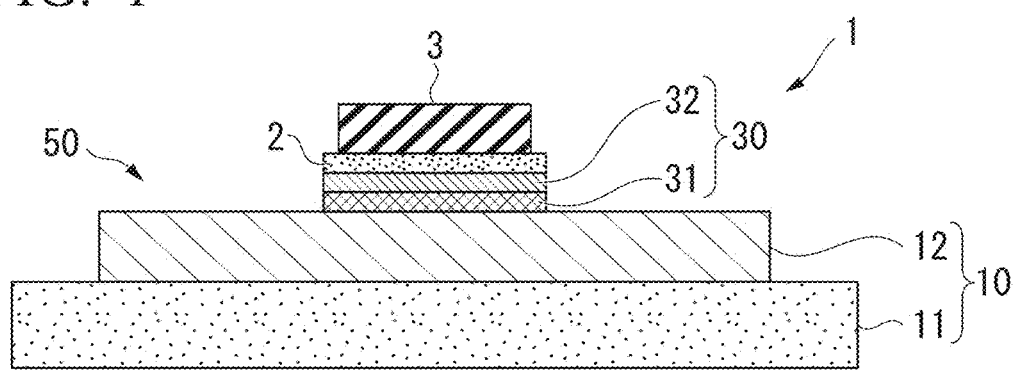
FIG. 1 is a schematic explanatory view of a semiconductor device (a power module) of a first embodiment of the present invention.

FIG. 1 illustrates the power module (the semiconductor device) 1 of the first embodiment of the present invention. This power module 1 includes a substrate for an Ag underlayer-attached power module (an Ag underlayer-attached insulating circuit substrate) 50 having an Ag underlayer 30 and a substrate for a power module 10 and a semiconductor element 3 joined to one surface (an upper surface in FIG. 1) of the substrate for an Ag underlayer-attached power module 50 through a joint layer 2.

As illustrated in FIG. 1, the substrate for a power module 10 includes a ceramic substrate 11 constituting an insulating layer and a circuit layer 12 disposed on one surface (an upper surface in FIG. 1) of the ceramic substrate 11.

The ceramic substrate 11 prevents electric connection between the circuit layer 12 disposed on one surface of the ceramic substrate 11 which is an insulating layer and a metallic layer (not illustrated) disposed on the other surface of the ceramic substrate 11 which is an insulating layer and is constituted of, for example, highly insulating aluminum nitride (AlN), silicon nitride ($Si_3N_4$), alumina ($Al_2O_3$), or the like. In the present embodiment, the ceramic substrate is constituted of aluminum nitride (AlN) having an excellent heat dissipation property. In addition, the thickness of the ceramic substrate 11 is set in a range of 0.2 to 1.5 mm and, in the present embodiment, set to 0.635 mm.

The circuit layer 12 is formed by joining a conductive metallic plate to one surface of the ceramic substrate 11. In the present embodiment, the circuit layer 12 is formed by joining an aluminum plate formed of a rolled plate of aluminum having a purity of 99.99 mass % or more (so-called 4N aluminum) to the ceramic substrate 11. In the circuit layer 12, a circuit pattern is formed, and one surface (an upper surface in FIG. 1) thereof is used as a mounting surface on which the semiconductor element 3 is mounted.

Here, the thickness of the circuit layer 12 is set in a range of 0.1 mm or more and 3.0 mm or less and, in the present embodiment, set to 0.6 mm.

In addition, on one surface (a surface opposite to the ceramic substrate 11) of the circuit layer 12, the Ag underlayer 30 is formed. In the present embodiment, the circuit layer 12 and the Ag underlayer 30 are Ag underlayer-attached metallic members.

Figure 2:
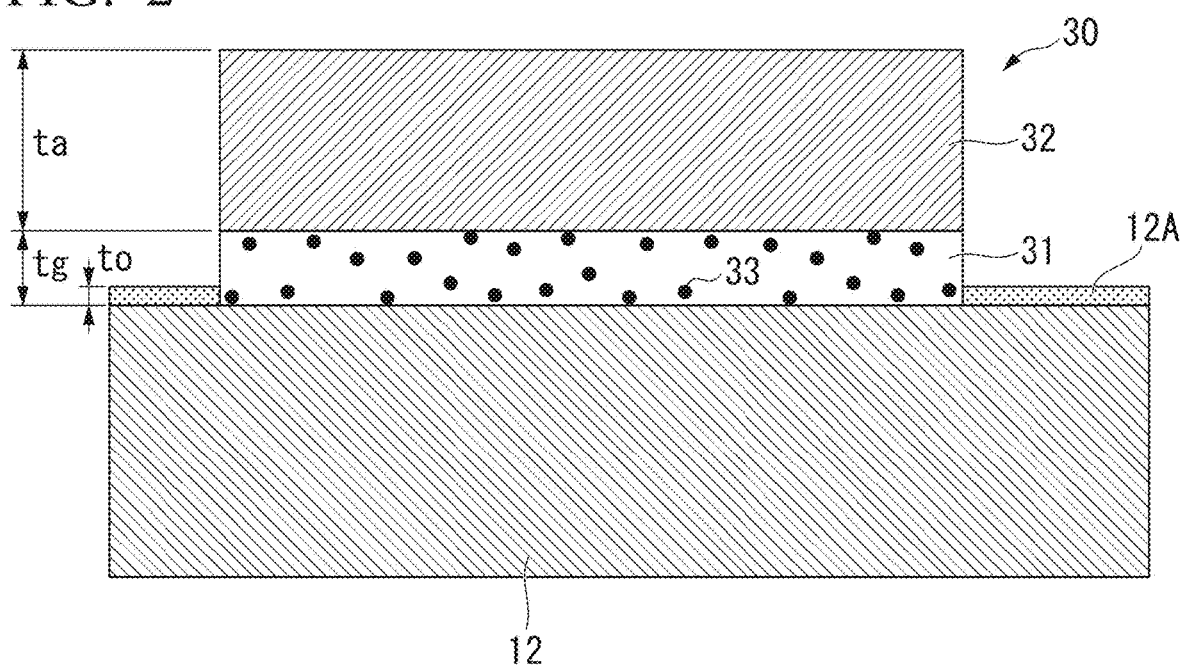
FIG. 2 is a main part enlarged cross-sectional view illustrating a joint portion between an Ag underlayer and a circuit layer.

The Ag underlayer 30 is a sintered body of glass-containing Ag paste including a glass component as described below. The Ag underlayer 30 includes a glass layer 31 formed on the circuit layer 12 side and an Ag layer 32 formed on the glass layer 31 in a state in which the semiconductor element 3 is joined to the Ag underlayer as illustrated in FIG. 1 and FIG. 2.

Inside the glass layer 31, fine conductive particles 33 having a particle diameter of approximately several nanometers are dispersed. These conductive particles 33 are crystalline particles containing at least one of Ag or Al. The conductive particles 33 in the glass layer 31 are observed using, for example, a transmission electron microscope (TEM).

In addition, inside the Ag layer 32, fine glass particles having a particle diameter of approximately several nanometers (not illustrated) are dispersed.

In addition, in the present embodiment, the circuit layer 12 is constituted of aluminum having a purity of 99.99 mass % or more, and thus, on the surface of the circuit layer 12, an aluminum oxide coating 12A naturally generated in the atmosphere is formed. Here, in a portion in which the Ag underlayer 30 is formed, the aluminum oxide coating 12A is removed, and the Ag underlayer 30 is directly formed on the circuit layer 12. That is, aluminum constituting the circuit layer 12 and the glass layer 31 are directly joined together as illustrated in FIG. 2.

In the present embodiment, as illustrated in FIG. 2, a thickness of the aluminum oxide coating 12A that is naturally generated on the circuit layer 12 is set in a range of 4 nm≤to≤6 nm. In addition, the Ag underlayer is constituted so that a thickness tg of the glass layer 31 is in a range of 0.01 µm≤tg≤5 µm and a thickness to of the Ag layer 32 is in a range of 1≤ta≤100 µm.

An electric resistance value P of the Ag underlayer 30 in a thickness direction is set to 0.5Ω or less. Here, in the present embodiment, the electric resistance value P of the Ag underlayer 30 in the thickness direction is an electric resistance value between an upper surface of the Ag underlayer 30 and an upper surface of the circuit layer 12 in FIG. 2. This is because the electric resistance of aluminum (4N aluminum) constituting the circuit layer 12 is extremely smaller than the electric resistance of the Ag underlayer 30 in the thickness direction. In the measurement of the electric resistance, an electric resistance between an upper surface central point of the Ag underlayer 30 and a point on the circuit layer 12 which is apart from a lower surface end portion of the Ag underlayer 30 in an outer circumferential direction of the circuit layer 12 by the same distance as a distance from the upper surface central point of the Ag underlayer 30 to an upper surface end portion of the Ag underlayer 30 is measured.

In addition, in the substrate for an Ag underlayer-attached power module 50 of the present embodiment, the area proportion of voids in the surface of the Ag underlayer 30 on the Ag layer 32 side, that is, a joining surface to which the semiconductor element 3 is joined, is set to 25% or less. The area proportion of voids in the surface of the Ag underlayer 30 on the Ag layer 32 side can be computed by observing the surface of the Ag underlayer 30 on the Ag layer 32 side using a laser microscope, binarizing the obtained image, and determining black portions as the voids.

In the power module 1 of the present embodiment, the joint layer 2 is provided between the semiconductor element 3 and the Ag underlayer 30 as illustrated in FIG. 1.

The joint layer 2 is formed of a sintered body of a joining material including at least one or both of Ag particles and silver oxide and an organic substance and, in the present embodiment, formed of a sintered body of silver oxide paste including silver oxide particles and a reducing agent formed of an organic substance. That is, the joint layer 2 is formed of a sintered body of Ag which is reduced from silver oxide. Here, particles generated by reducing silver oxide are extremely fine, for example, have a particle diameter of 10 mm to 1 μm, and the joint layer 2 formed of a dense sintered body of Ag is formed.

In the joint layer 2, unlike the Ag layer 32, fine glass particles having a particle diameter of approximately several nanometers are not dispersed.

Figure 3:
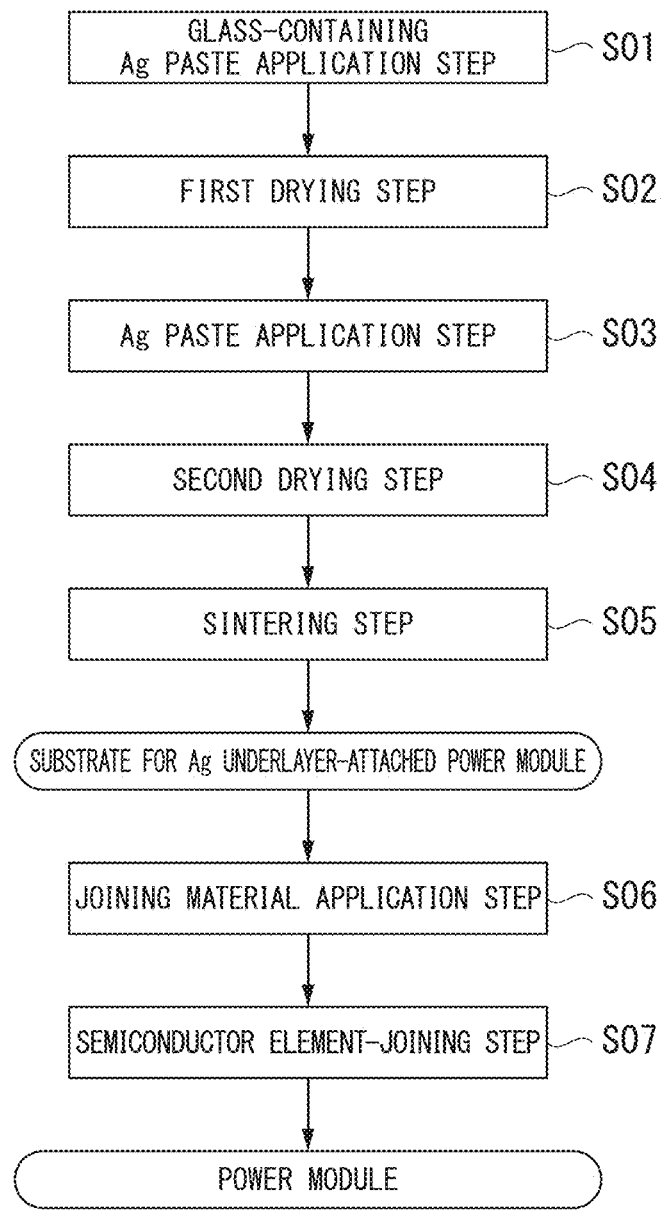
FIG. 3 is a flowchart of a method for manufacturing an Ag underlayer-attached insulating circuit substrate (a substrate for an Ag underlayer-attached power module) and a method for manufacturing a semiconductor device (a power module) of the first embodiment of the present invention.
Figure 4:
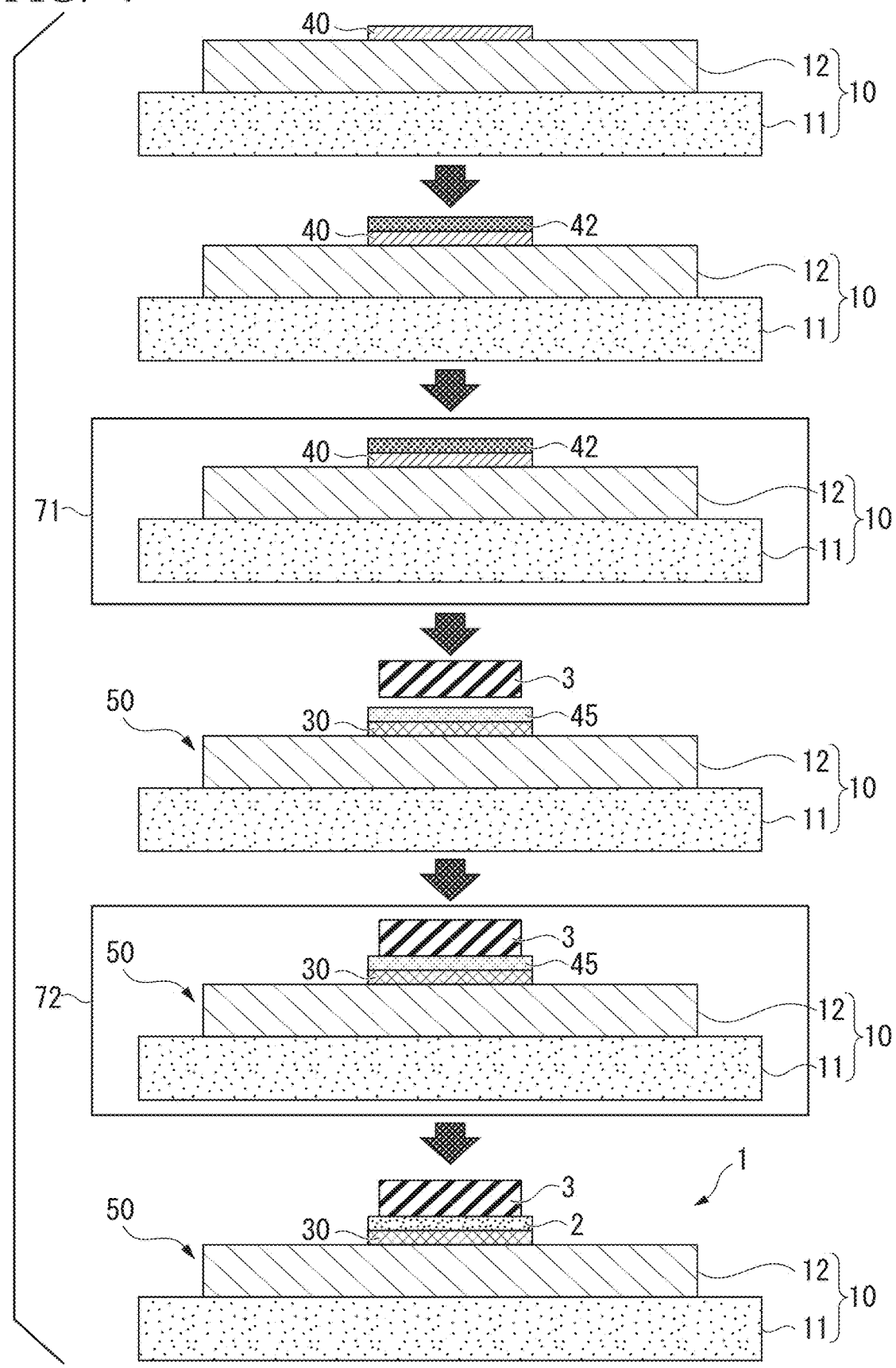
FIG. 4 is a schematic explanatory view of the method for manufacturing the Ag underlayer-attached insulating circuit substrate (the substrate for an Ag underlayer-attached power module) and the method for manufacturing the semiconductor device (the power module) of the first embodiment of the present invention.

Next, a method for manufacturing the power module 1 and a method for manufacturing the substrate for an Ag underlayer-attached power module 50 of the present embodiment will be described with reference to FIG. 3 and FIG. 4.

(Glass-Containing Ag Paste Application Step S01)

First, the substrate for a power module 10 having the circuit layer 12 formed on one surface of the ceramic substrate 11 is prepared, and glass-containing Ag paste 40 is applied onto the circuit layer 12 of the substrate for a power module 10. In the application of the glass-containing Ag paste 40, a variety of means such as a screen printing method, an offset printing method, and a photosensitive process can be employed.

The thickness of the glass-containing Ag paste 40 applied may be set in a range of 1 μm or more and 30 μm or less. In the present embodiment, the glass-containing Ag paste 40 is formed in a pattern shape using a screen printing method.

Here, the above-described glass-containing Ag paste will be described.

The glass-containing Ag paste contains an Ag powder, a glass powder, a resin, a solvent, and a dispersant, the content of a powder component including the Ag powder and the glass powder is set to 60 mass % or more and 90 mass % or less of the entire glass-containing Ag paste, and the remainder is the resin, the solvent, and the dispersant.

In the present embodiment, the content of the powder component including the Ag powder and the glass powder is set to 85 mass % of the entire glass-containing Ag paste.

In addition, the viscosity of the glass-containing Ag paste is preferably adjusted to 10 Pa·s or more and 500 Pa·s or less and more preferably adjusted to 50 Pa·s or more and 300 Pa·s or less.

The particle diameter of the Ag powder is set to 0.05 μm or more and 1.0 μm or less, and, in the present embodiment, an Ag powder having an average particle diameter of 0.8 μm is used.

The glass powder contains any one or more of, for example, lead oxide, zinc oxide, silicon oxide, boron oxide, phosphorus oxide, and bismuth oxide, the glass transition temperature is set to 300° C. or higher and 450° C. or lower, the softening temperature is set to 600° C. or lower, and the crystallization temperature is set to 450° C. or higher.

In the present embodiment, a glass powder which includes lead oxide, zinc oxide, and boron oxide and has an average particle diameter of 0.5 μm is used.

In addition, a weight ratio A/G of a weight A of the Ag powder to a weight G of the glass powder is adjusted in a range of 80/20 to 99/1, and, in the present embodiment, is set to A/G of 80/5.

As the solvent, a solvent having a boiling point of 200° C. or higher is appropriate, and, in the present embodiment, diethylene glycol dibutyl ether is used.

The resin adjusts the viscosity of the glass-containing Ag paste, and a resin that is decomposed at 500° C. or higher is appropriate. In the present embodiment, ethyl cellulose is used.

In addition, in the present embodiment, a dicarboxylic acid-based dispersant is added. The glass-containing Ag paste may be constituted without adding any dispersants.

The glass-containing Ag paste is produced by preliminarily mixing a powder mixture obtained by mixing the Ag powder and the glass powder and an organic mixture obtained by mixing the solvent and the resin using a mixer with the dispersant, mixing the obtained preliminary mixture using a roll milling machine while being kneaded, and filtering the obtained kneaded substance using a paste filter.

(First Drying Step S02)

Next, the glass-containing Ag paste 40 is dried in a state of being applied to one surface of the circuit layer 12. In a first drying step S02, a drying treatment is carried out by holding the glass-containing Ag paste at a temperature of 100° C. or higher and 150° C. or lower for 15 minutes or longer and 30 minutes or shorter so that the solvent is sufficiently dried. The atmosphere during the drying is the atmosphere, a vacuum, or an inert atmosphere of $N_2$, Ar, or the like.

(Ag Paste Application Step S03)

Next, an Ag paste 42 is applied onto the dried glass-containing Ag paste 40. The thickness of the Ag paste 42 applied may be set to 1 μm or more and 30 μm or less.

The Ag paste 42 is paste obtained by removing a glass component from the glass-containing Ag paste 40. The Ag powder that is used in the Ag paste 42 preferably has the same particle diameter as the Ag powder that is used in the glass-containing Ag paste 40. The use of an Ag powder having the same particle diameter enables the favorable sintering of the Ag powder in a sintering step described below.

The Ag paste 42 is applied onto the dried glass-containing Ag paste 40 using the same method as for the glass-containing Ag paste 40.

(Second Drying Step S04)

Next, the Ag paste 42 is dried in a state of being applied so as to be laminated on the glass-containing Ag paste 40. In a second drying step S04, a drying treatment is carried out by holding the Ag paste at a temperature of 100° C. or higher and 150° C. or lower for 15 minutes or longer and 30 minutes or shorter so that the solvent is sufficiently dried. The atmosphere during the drying is the atmosphere, a vacuum, or an inert atmosphere of $N_2$, Ar, or the like.

Here, a ratio t1/t2 of a thickness t1 of the dried glass-containing Ag paste 40 to a thickness t2 of the Ag paste 42 is preferably set in a range of 0.2 or more and 5.0 or less.

(Sintering Step S05)

Next, the glass-containing Ag paste 40 and the Ag paste 42 are charged into a heating furnace 71 in a state of being laminated on one surface of the circuit layer 12, a heating treatment is carried out, and the glass-containing Ag paste 40 is sintered. The sintering temperature at this time is set to, for example, 350° C. or higher and 645° C. or lower. With the sintering step S05, the Ag underlayer 30 including the glass layer 31 and the Ag layer 32 is formed. In addition, the area proportion of voids in the surface of the Ag underlayer 30 on the Ag layer 32 side is set to 25% or less.

In the sintering step S05, a glass powder component in the glass-containing Ag paste 40 softens, flows, and reacts with Ag or Al, whereby the glass layer 31 in which the fine conductive particles 33 having a particle diameter of approximately several nanometers are dispersed and the Ag layer 32 in which fine glass particles having a particle diameter of approximately several nanometers are dispersed are formed.

The Ag paste 42 does not contain any glass which impairs the sintering, and thus crystal grains of Ag easily grow. Therefore, in a region in which the Ag paste 42 has been sintered, that is, the surface of the Ag underlayer 30 on the Ag layer 32 side, the number of voids decreases.

The area proportion of voids is more preferably 15% or less.

In the sintering step S05, during the sintering of the glass-containing Ag paste 40, an aluminum oxide coating 12A naturally generated on the surface of the circuit layer 12 is melted and removed by the glass layer 31, and the glass layer 31 is directly formed on the circuit layer 12. In addition, the fine conductive particles 33 having a particle diameter of approximately several nanometers are dispersed inside the glass layer 31. These conductive particles 33 are crystalline particles containing at least one of Ag or Al and are assumed to be precipitated inside the glass layer 31 during the sintering.

Furthermore, the glass particles having a particle diameter of approximately several micrometers are dispersed inside the Ag layer 32. These glass particles are assumed to be particles generated by the agglomeration of a residual glass component in a process in which the sintering of the Ag particles proceeds.

The substrate for an Ag underlayer-attached power module 50 of the present embodiment is manufactured in the above-described manner.

(Joining Material Application Step S06)

Next, to the surface of the Ag underlayer 30, a joining material 45 including either or both of Ag and silver oxide and an organic substance is applied as a joining material which turns into the joint layer 2. In the present embodiment, silver oxide paste is used as the joining material.

In the application of the silver oxide paste, a variety of means such as a screen printing method, an offset printing method, and a photosensitive process can be employed. In the present embodiment, the silver oxide paste 45 is printed using a screen printing method.

Here, the silver oxide paste will be described.

The silver oxide paste contains a silver oxide powder (silver oxide particles), a reducing agent, a resin, and a solvent and, in the present embodiment, contains an organic metallic compound powder in addition to the above-described components.

In the silver oxide paste, the content of the silver oxide powder is set to 60 mass % or more and 92 mass % or less of the entire silver oxide paste, the content of the reducing agent is set to 5 mass % or more and 20 mass % or less of the entire silver oxide paste, the content of the organic metallic compound powder is set to 0 mass % or more and 10 mass % or less of the entire silver oxide paste, and the solvent is a remainder. To this silver oxide paste, neither a dispersant nor a resin is added in order to suppress the remaining of an unreacted organic substance in the joint layer 2 that is obtained by sintering.

As the reducing agent, an organic substance having a reducing property is used, and it is possible to use, for example, an alcohol or an organic acid.

The organic metallic compound is a compound having an action of accelerating the reduction reaction of silver oxide or the decomposition reaction of the organic substance with an organic acid generated by thermal decomposition, and, for example, a carboxylic acid-based metallic salt such as Ag formate, Ag acetate, Ag propionate, Ag benzoate, or Ag oxalate or the like is applied.

The viscosity of the silver oxide paste is preferably adjusted to 10 Pa·s or more and 500 Pa·s or less and more preferably adjusted to 50 Pa·s or more and 300 Pa·s or less.

(Semiconductor Element-Joining Step S07)

Next, the joining material (silver oxide paste) 45 is dried (for example, stored at room temperature in the atmosphere for 24 hours) in a state of being applied, then, the semiconductor element 3 is laminated on the joining material 45, the semiconductor element 3 and the substrate for an Ag underlayer-attached power module 50 are charged into a heating furnace 72 in a state of being laminated, the joining material (silver oxide paste) 45 is sintered, and the semiconductor element 3 is joined by forming the joint layer 2.

In the semiconductor element-joining step S07, the semiconductor element 3 and the substrate for an Ag underlayer-attached power module 50 are heated in a state of being pressurized in a lamination direction, whereby it is possible to more reliably join the semiconductor element and the substrate for an Ag underlayer-attached power module. In this case, the pressurization pressure in the lamination direction is desirably set to 0.5 to 10 MPa.

The joint layer 2 is formed on the Ag underlayer 30 in this manner, and the semiconductor element 3 and the circuit layer 12 are joined together. Therefore, the power module 1 of the present embodiment is manufactured.

According to the power module 1 and the substrate for an Ag underlayer-attached power module 50 according to the present embodiment provided with the above-described constitution, the Ag underlayer 30 including the glass layer 31 and the Ag layer 32 laminated and disposed on the glass layer 31 is formed on one surface of the circuit layer 12, and the area proportion of voids in the surface of the Ag underlayer 30 on the Ag layer 32 side (that is, the joining-side surface with the semiconductor element 3 or the contact surface with the joint layer 2) is set to 25% or less, and thus, even in a case in which a thermal cycle reaching a relatively high temperature is loaded, it is possible to suppress the generation of cracks from the voids in the surface of the Ag underlayer 30 on the Ag layer 32 side 30 as origination points in the joint layer 2 formed of the sintered body of the silver oxide paste formed on the Ag underlayer 30. Therefore, even in a case in which the power module and the substrate for an Ag underlayer-attached power module are used in a high-temperature environment, it is possible to ensure the joining reliability between the circuit layer 12 and the semiconductor element 3.

In the present invention, the high-temperature environment refers to a temperature environment of 200° C. or higher.

In addition, in the present embodiment, the glass-containing Ag paste application step S01 of applying the glass-containing Ag paste 40 onto the circuit layer 12, the first drying step S02 of drying the applied glass-containing Ag paste 40, the Ag paste application step S03 of applying Ag paste 42 onto the dried glass-containing Ag paste 40, the second drying step S04 of drying the applied Ag paste 42, and the sintering step S05 of sintering the glass-containing Ag paste 40 and the Ag paste 42 laminated on the circuit layer 12 are provided, and thus it is possible to form the glass layer 31 on the circuit layer 12 side, form the Ag layer 32 on the glass layer 31, and set the area proportion of voids in the Ag layer 32 surface to 25% or less while preventing the generation of voids attributed to glass in the surface of the Ag layer 32.

Second Embodiment

Next, a second embodiment of the present invention will be described with reference to FIG. 5 to FIG. 8.

Figure 5:
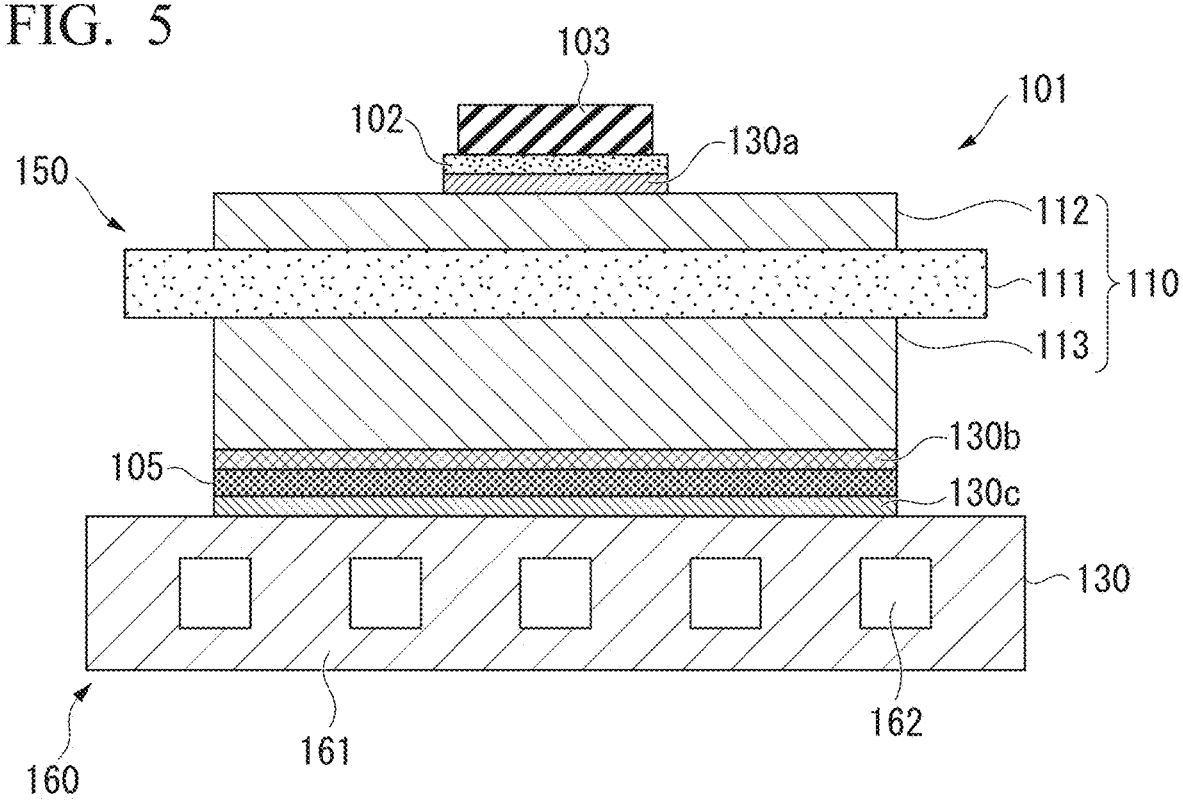
FIG. 5 is a schematic explanatory view of a semiconductor device (a power module) and a heat sink-attached insulating circuit substrate (a substrate for a heat sink-attached power module) of a second embodiment of the present invention.

FIG. 5 illustrates a semiconductor device 101 of the second embodiment of the present invention. The semiconductor device 101 includes a substrate for a heat sink-attached power module (heat sink-attached insulating circuit substrate) 160 and a semiconductor element 103 joined to one surface (an upper surface in FIG. 5) side of the substrate for a heat sink-attached power module 160 through a first joint layer 102.

In addition, the substrate for a heat sink-attached power module 160 includes a substrate for an Ag underlayer-attached power module 150 and a heat sink 161 joined to the other surface (a lower surface in FIG. 5) side of the substrate for an Ag underlayer-attached power module 150 through the second joint layer 105.

As illustrated in FIG. 5, the substrate for an Ag underlayer-attached power module 150 includes a ceramic substrate 111, a circuit layer 112 (metallic member) disposed on one surface (an upper surface in FIG. 5) of the ceramic substrate 111, a metallic layer 113 (metallic member) disposed on the other surface (a lower surface in FIG. 5) of the ceramic substrate 111, a first Ag underlayer 130a formed on one surface of the circuit layer 112, and a second Ag underlayer 130b formed on the other surface of the metallic layer 113.

The ceramic substrate 111 prevents electric connection between the circuit layer 112 and the metallic layer 113 and, in the present embodiment, is constituted of highly insulating aluminum nitride (AlN). Here, the thickness of the ceramic substrate 111 is set in a range of 0.2 to 1.5 mm and, in the present embodiment, set to 0.635 mm.

The circuit layer 112 is formed by joining a copper plate formed of copper or a copper alloy to one surface of the ceramic substrate 111. In the present embodiment, as the copper plate constituting the circuit layer 112, a rolled plate of oxygen-free copper is used. In the circuit layer 112, a circuit pattern is formed, and one surface thereof is used as a mounting surface on which the semiconductor element 103 is mounted.

Here, the thickness of the circuit layer 112 is set in a range of 0.1 mm or more and 3.0 mm or less and, in the present embodiment, set to 0.6 mm.

The metallic layer 113 is formed by joining an aluminum plate formed of aluminum or an aluminum alloy onto the other surface of the ceramic substrate 111. In the present embodiment, as the aluminum plate constituting the metallic layer 113, a rolled plate of aluminum having a purity of 99.99 mass % or more (4N aluminum) is used. Here, the thickness of the metallic layer 113 is set in a range of 0.5 mm or more and 6 mm or less and, in the present embodiment, set to 1.0 mm.

The heat sink 161 is a member for diffusing heat on the insulating circuit substrate 110 side. The heat sink 161 is desirably constituted of a material having a favorable thermal conductive property and, in the present embodiment, constituted of A6063 (Al alloy). In this heat sink 161, flow channels 162 for allowing the flow of a fluid for cooling are provided.

In addition, in a region of the heat sink 161 which is joined to the metallic layer 113, a third Ag underlayer 130c is formed.

In the present embodiment, the circuit layer 112, the first Ag underlayer 130a, the metallic layer 113, the second Ag underlayer 130b, the heat sink 161, and the third Ag underlayer 130c are each formed of an Ag underlayer-attached metallic member.

The first Ag underlayer 130a, the second Ag underlayer 130b, and the third Ag underlayer 130c are, similar to the first embodiment, formed of a sintered body of a glass-containing Ag paste including a glass component and an Ag paste. The first Ag underlayer 130a, the second Ag underlayer 130b, and the third Ag underlayer 130c include, similar to the first embodiment, a glass layer formed on the circuit layer 112, the metallic layer 113, and the heat sink 161 side and an Ag layer formed on the glass layer in a non-joined state.

In addition, in the present embodiment, the area proportions of voids in the Ag layer surfaces of the first Ag underlayer 130a, the second Ag underlayer 130b, and the third Ag underlayer 130c are set to 25% or less.

In addition, in the power module 101 of the present embodiment, the first joint layer 102 and a second joint layer 105 are formed of a sintered body of a joining material including at least one or both of Ag particles and silver oxide particles and an organic substance, and, in the present embodiment, similar to the first embodiment, formed of a sintered body of a silver oxide paste including silver oxide particles and a reducing agent formed of an organic substance.

Figure 6:
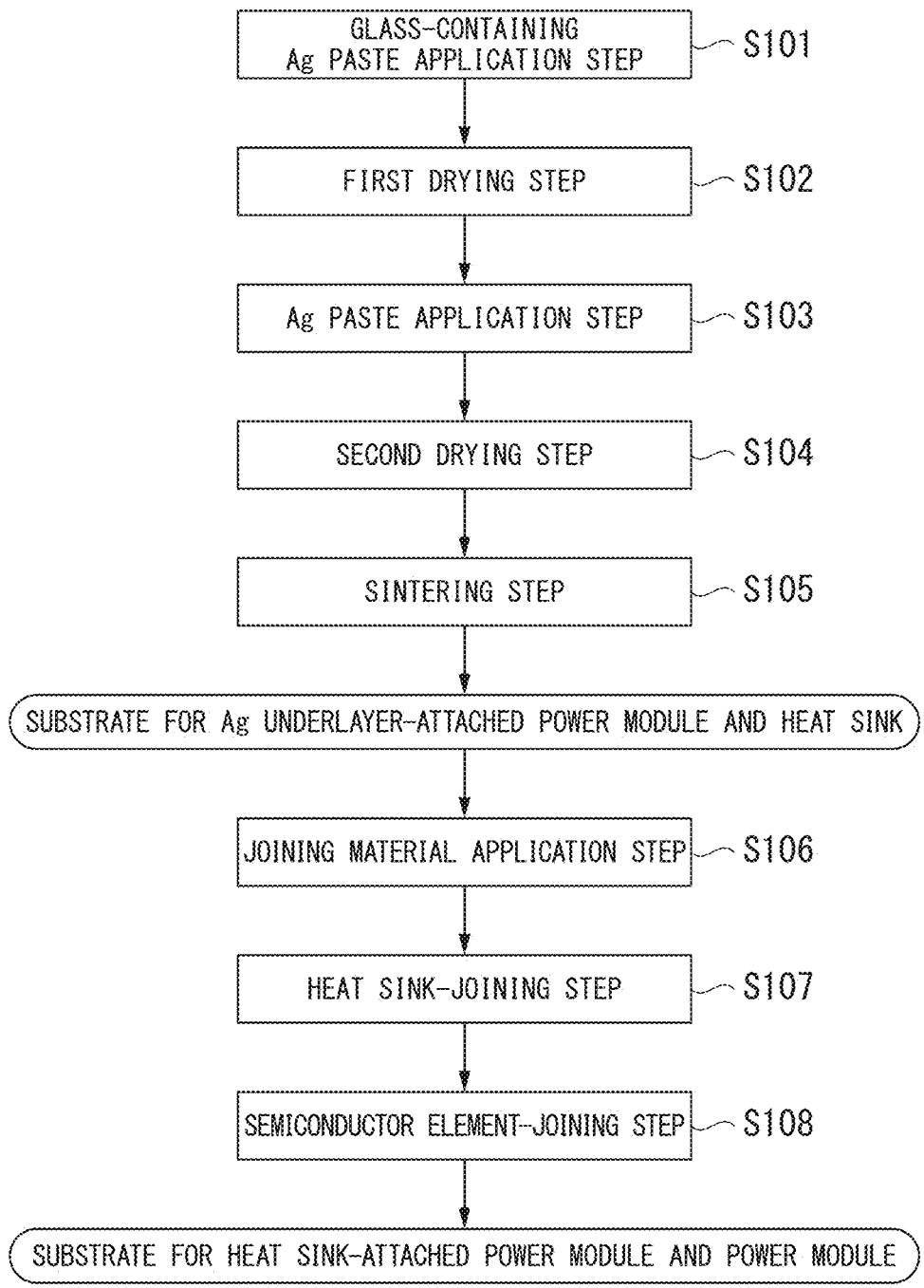
FIG. 6 is a flowchart of a method for manufacturing the heat sink-attached insulating circuit substrate (the substrate for the heat sink-attached power module) and a method for manufacturing the semiconductor device (the power module) of the second embodiment of the present invention.
Figure 7A:
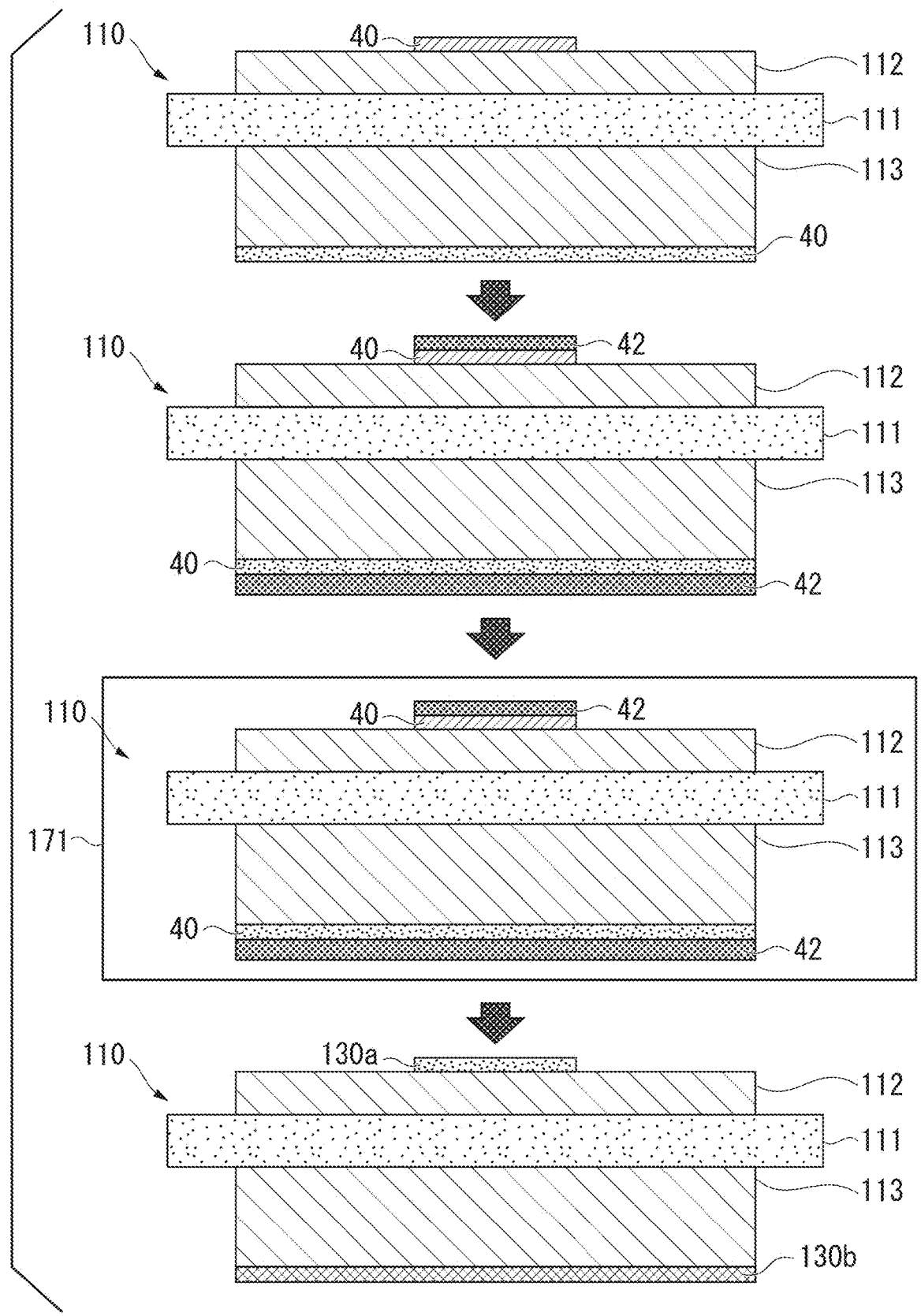
FIG. 7A is a schematic explanatory view of a method for manufacturing an Ag underlayer-attached insulating circuit substrate (a substrate for a heat sink-attached power module) of the second embodiment of the present invention.
Figure 7B:
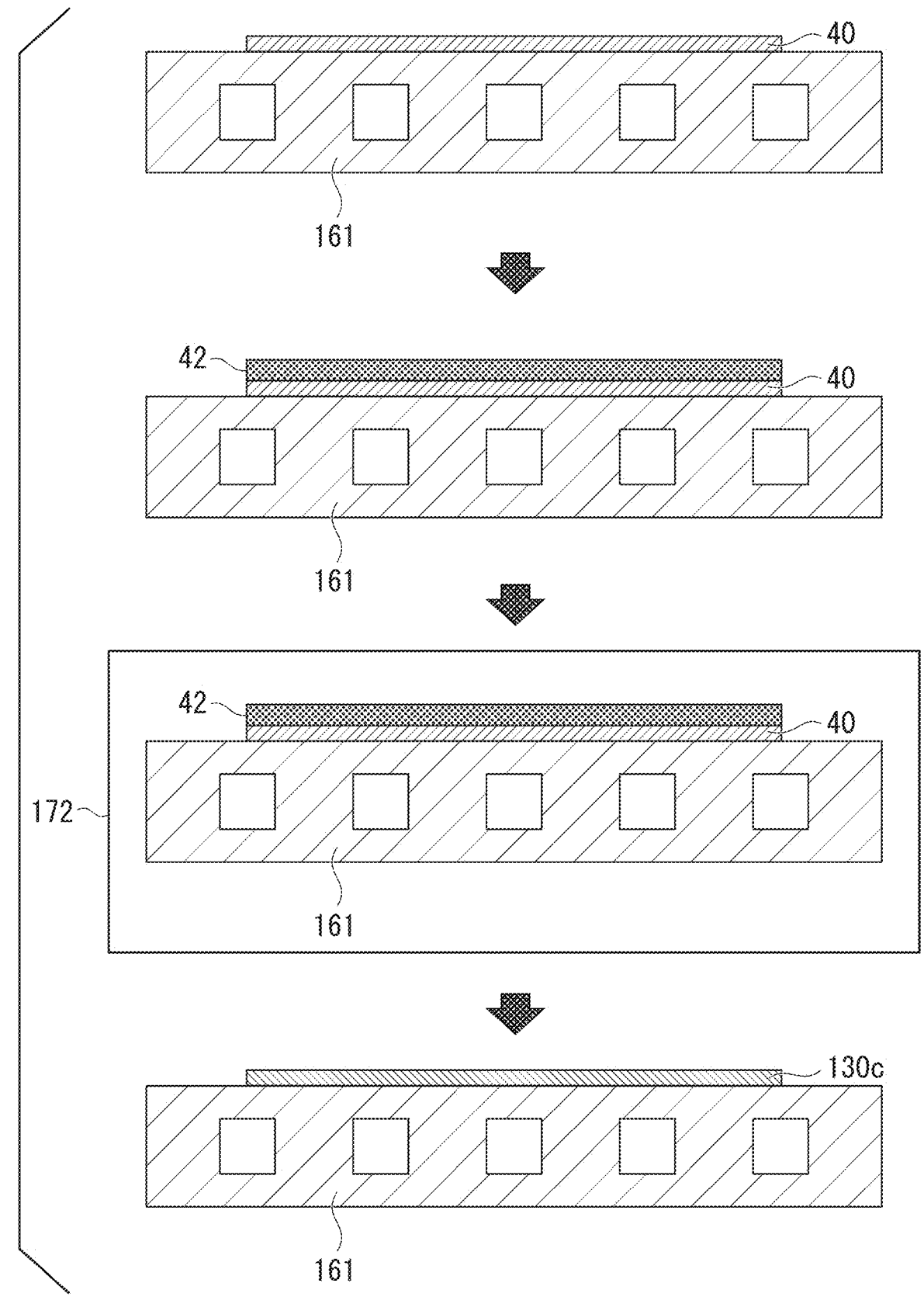
FIG. 7B is a schematic explanatory view of the method for manufacturing the Ag underlayer-attached insulating circuit substrate (the substrate for a heat sink-attached power module) of the second embodiment of the present invention.
Figure 8:
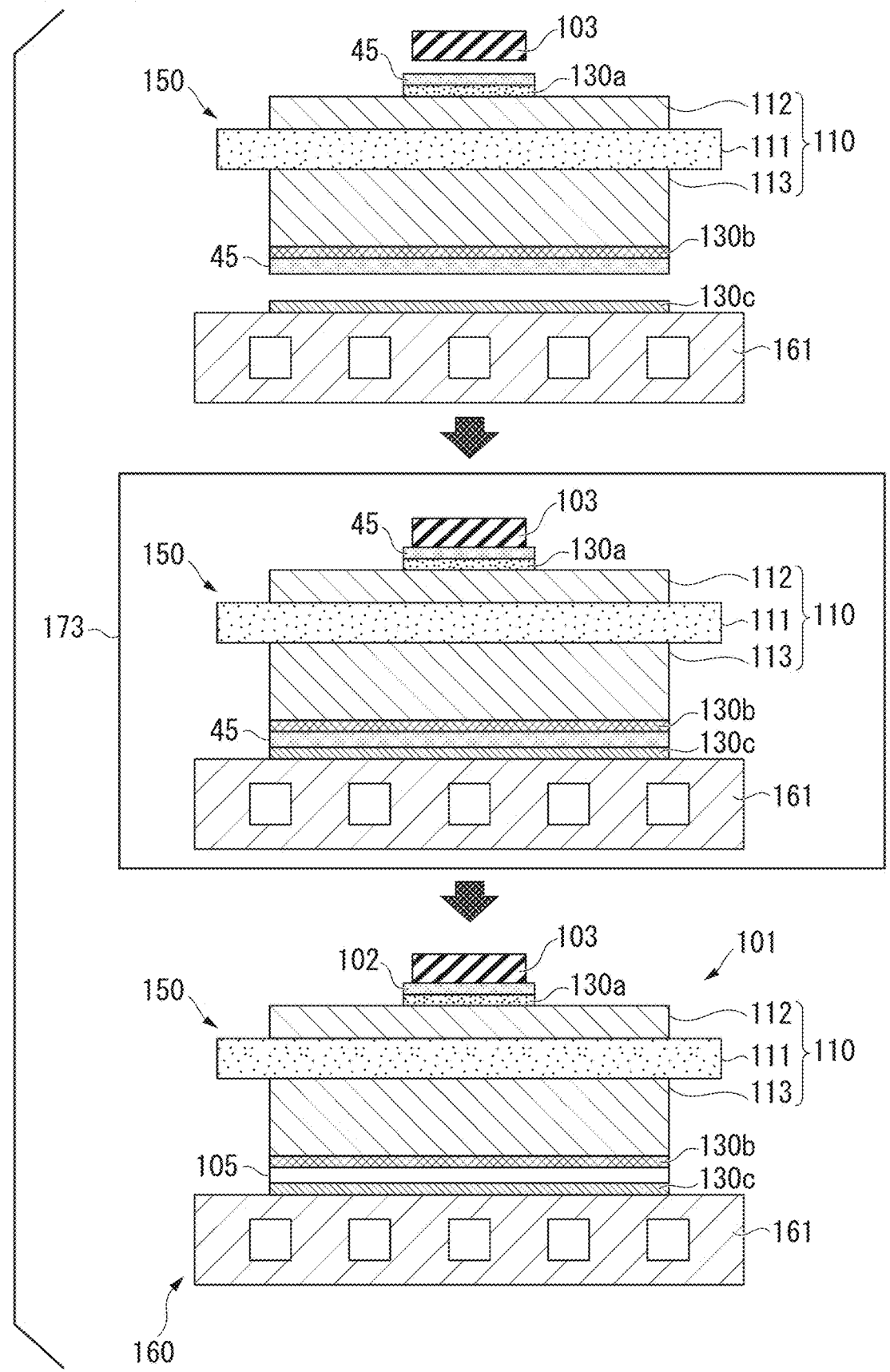
FIG. 8 is a schematic explanatory view of the method for manufacturing the heat sink-attached insulating circuit substrate (the substrate for the heat sink-attached power module) and the method for manufacturing the semiconductor device (the power module) of the second embodiment of the present invention.

Next, a method for manufacturing the power module 101 and methods for manufacturing the substrate for an Ag underlayer-attached power module 150 and the substrate for a heat sink-attached power module 160 of the present embodiment will be described with reference to FIG. 6 to FIG. 8.

(Glass-Containing Ag Paste Application Step S101)

First, the substrate for a power module 110 having the circuit layer 112 formed on one surface of the ceramic substrate 111 and the metallic layer 113 formed on the other surface of the ceramic substrate 111 is prepared, the glass-containing Ag paste 40 is applied to the circuit layer 112 of the substrate for a power module 110, and the glass-containing Ag paste 40 is applied to the metallic layer 113. The thickness of the glass-containing Ag paste applied may be set in a range of 1 μm or more and 30 μm or less.

Furthermore, the glass-containing Ag paste 40 is applied to a joining surface of the heat sink 161 which is joined to the metallic layer 113.

(First Drying Step S102) Next, the glass-containing Ag paste 40 is dried in a state of being applied to the circuit layer 112, the metallic layer 113, and the heat sink 161.

(Ag Paste Application Step S103)

Next, the Ag paste 42 is applied onto the dried glass-containing Ag paste 40.

The Ag paste 42 is a paste obtained by removing the glass component from the glass-containing Ag paste 40. The Ag powder that is used in the Ag paste 42 preferably has the same particle diameter as the Ag powder that is used in the glass-containing Ag paste 40. The use of an Ag powder having the same particle diameter enables the favorable sintering of the Ag powder in a sintering step described below.

(Second Drying Step S104)

Next, the Ag paste 42 is dried in a state of being applied so as to be laminated on the glass-containing Ag paste 40.

Here, the ratio t1/t2 of the thickness t1 of the dried glass-containing Ag paste 40 to the thickness t2 of the Ag paste 42 is preferably set in a range of 0.2 or more and 5.0 or less.

(Sintering Step S105)

Next, the glass-containing Ag paste 40 and the Ag paste 42 are charged in heating furnaces 171 and 172 in a state of being laminated, and the glass-containing Ag paste 40 and the Ag paste 42 are sintered. The sintering temperature at this time is set to, for example, 350° C. or higher and 645° C. or lower.

With the sintering step S105, the first Ag underlayer 130a including the glass layer and the Ag layer, the second Ag underlayer 130b, and the third Ag underlayer 130c are formed.

In addition, the area proportions of voids in the Ag layer surfaces of the first Ag underlayer 130a, the second Ag underlayer 130b, and the third Ag underlayer 130c are set to 25% or less.

In the above-described manner, the substrate for an Ag underlayer-attached power module 150 of the present embodiment is manufactured, and the heat sink 161 on which the third Ag underlayer 130c is formed is manufactured.

(Joining Material Application Step S106)

Next, to the surface of the first Ag underlayer 130a, the joining material 45 including either or both of Ag and silver oxide and an organic substance is applied as a joining material which turns into the first joint layer 102, and the joining material 45 including either or both of Ag and silver oxide and an organic substance is applied to the surface of the second Ag underlayer 130b as a joining material which turns into the second joint layer 105. In the present embodiment, a silver oxide paste is used as the joining material.

(Heat Sink Joining Step S107 and Semiconductor Element Joining Step S108)

Next, the joining material (silver oxide paste) 45 is dried (for example, stored at room temperature in the atmosphere for 24 hours) in a state of being applied, then, the semiconductor element 103 is laminated on the joining material 45 applied to the first Ag underlayer 130a, and the heat sink 161 is laminated on the joining material 45 applied to the second Ag underlayer 130b. At this time, the third Ag underlayer 130c formed on the heat sink 161 is disposed so as to face the joining material 45 side.

In addition, the semiconductor element 103, an insulating circuit substrate 110, and the heat sink 161 are charged into a heating furnace 173 in a state of being laminated, and the joining material (silver oxide paste) 45 is sintered. At this time, the semiconductor element 103, an insulating circuit substrate 110, and the heat sink 161 are heated in a state of being pressurized in a lamination direction, whereby it is possible to more reliably join the semiconductor element, the insulating circuit substrate, and the heat sink. In this case, the pressurization pressure is desirably set to 0.5 to 10 MPa.

In the above-described manner, the semiconductor element 103 and the circuit layer 112 are joined together, and the metallic layer 113 and the heat sink 161 are joined together, whereby the semiconductor device 101 and the substrate for a heat sink-attached power module 160 of the present embodiment are manufactured.

According to the semiconductor device 101 and the substrate for an Ag underlayer-attached power module 150 of the second embodiment provided with the above-described constitution, the same effects as those of the first embodiment can be exhibited.

In addition, according to the substrate for a heat sink-attached power module 160 of the present embodiment, the second Ag underlayer 130b is formed on the surface of the metallic layer 113, the third Ag underlayer 130c is formed on the joining surface of the heat sink 161, and the second joint layer 105 formed of the sintered body of a silver oxide paste is formed between the second and third Ag underlayers 130b and 130c, and thus it is possible to reliably join the metallic layer 113 and the heat sink 161.

In addition, the area proportions of voids in the surfaces of the second Ag underlayer 130b and the third Ag underlayer 130c on the Ag layer side are set to 25% or less, and thus, during the use in a high-temperature environment, it is possible to suppress the generation of cracks from the voids present in the Ag layer surfaces of the second Ag underlayer 130b and the third Ag underlayer 130c as origination points in the joint layer 105. Therefore, even in a case in which the power module, the substrate for an Ag underlayer-attached power module, and the substrate for a heat sink-attached power module are used in a high-temperature environment, it becomes possible to ensure the joining reliability between the metallic layer 113 and the heat sink 161.

Hitherto, the embodiments of the present invention have been described, but the present invention is not limited thereto and can be appropriately modified within the scope of the technical concept of the invention.

For example, as the metallic plate constituting the circuit layer, the rolled plate of pure aluminum having a purity of 99.99 mass % (4N aluminum) or the rolled plate of oxygen-free copper has been described, but the metallic plate is not limited thereto, and other metallic plates constituted of aluminum, an aluminum alloy, copper, or a copper alloy may also be used. Furthermore, a metallic plate having a structure in which a copper plate and an aluminum plate are joined together in a solid-phase diffusion manner may also be used.

In addition, as the insulating layer, the insulating layer for which the ceramic substrate formed of AlN is used has been described, but the insulating layer is not limited thereto, and a ceramic substrate formed of $Si_3N_4$, $Al_2O_3$, or the like may also be used, and the insulating layer may also be constituted of an insulating resin.

In addition, the heat sink is not limited to the heat sinks exemplified in the present embodiment, and the structure of the heat sink is not particularly limited.

Furthermore, a buffer layer may be provided between the heat sink and the metallic layer. As the buffer layer, it is possible to use a plate material formed of aluminum, an aluminum alloy, or a complex material including aluminum (for example, AlSiC or the like).

In addition, in the present embodiment, as the semiconductor device, the power module in which the power semiconductor element is mounted has been described as an example, but the semiconductor device is not limited thereto and may be a semiconductor device in which a semiconductor element is mounted on a circuit layer formed of a conductive material.

Figure 9:
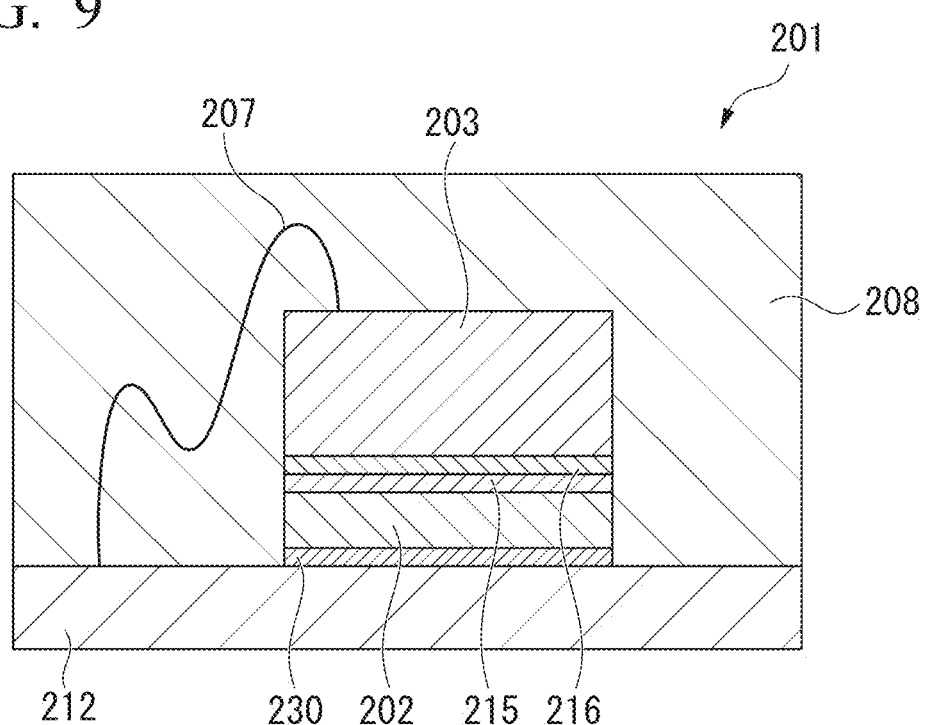
FIG. 9 is a schematic explanatory view of a semiconductor device of another embodiment of the present invention.

For example, as illustrated in FIG. 9, the semiconductor device may also be an LED device (semiconductor device) in which an LED element (semiconductor element) is mounted.

An LED device 201 illustrated in FIG. 9 includes an LED element 203 and a circuit layer 212 formed of a conductive material. The LED element 203 is electrically connected with the circuit layer 212 using a bonding wire 207, and the LED element 203 and the bonding wire 207 are sealed with a sealing material 208. An Ag underlayer 230 formed of a sintered body of a glass-containing Ag paste and an Ag paste on one surface of the circuit layer 212, and a conductive reflective film 216 and a protective film 215 are provided on a rear surface of the LED element 203. In addition, the LED element 203 is joined onto the Ag underlayer 230 through a joint layer 202 formed of a sintered body of a joining material including either or both of Ag and silver oxide and an organic substance.

In the above-described LED device 201 as well, the Ag underlayer 230 is formed on one surface of the circuit layer 212, and the area proportion of voids in the Ag layer surface (that is, a joining surface with the LED element 203) of the Ag underlayer 230 is set to 25% or less, and thus, even in a case in which the LED device is used in a high-temperature environment, it is possible to suppress the generation of cracks in the joint layer due to the voids present in the Ag layer surface. Therefore, even in a high-temperature environment, the joining reliability between the circuit layer 212 and the LED element 203 is excellent.

Examples

A confirmation experiment carried out to confirm the effectiveness of the present invention will be described.

A metallic plate was joined to one surface or the other surface of a ceramic substrate, thereby forming a circuit layer and a metallic layer. Here, as the ceramic substrate, a AlN substrate having a size of 27 mm×17 mm×0.6 mm was used. As the metallic plate which turned into the circuit layer and the metallic layer, a material shown in Table 1 having a size of 25 mm×15 mm×0.3 mm was used.

In a case in which the metallic plate is an aluminum plate, as a joining material, a lead-free Al—Si-based brazing material was used. In addition, in a case in which the metallic plate is a copper plate, as the joining material, a lead-free active metal brazing material (Ag—Cu—Ti brazing material) was used.

In each invention example, the glass-containing Ag paste described in the embodiment was applied to a surface of the circuit layer and dried at 150° C. for 30 minutes, then, an Ag paste was applied and dried at 150° C. for 30 minutes, and then, a heating treatment was carried out at 550° C. for 30 minutes, thereby forming an Ag underlayer.

As the glass powder in the glass-containing Ag paste, a lead-free glass powder including 90.6 mass % of $Bi_2O_3$, 2.6 mass % of ZnO, and 6.8 mass % of $B_2O_3$ was used. In addition, as the resin, ethyl cellulose was used, and, as the solvent, diethylene glycol dibutyl ether was used. Furthermore, a dicarboxylic acid-based dispersant was added thereto. As the Ag powder, a powder having a particle diameter of 0.8 μm was used.

In addition, as the Ag paste, an Ag paste obtained by removing the glass powder from the above-described glass-containing Ag paste was used.

The amount of the glass-containing Ag paste applied and the amount of the Ag paste applied are as shown in Table 1.

In the above-described manner, a substrate for an Ag underlayer-attached power module of the invention example was obtained.

In addition, a silver oxide paste was applied (at a thickness applied of 10 μm) onto the Ag underlayer in the substrate for an Ag underlayer-attached power module of the invention example, then, a semiconductor element was disposed, and the silver oxide paste was sintered so as to form a joint layer, thereby producing a semiconductor device of the invention example.

Here, as the firing conditions of the silver oxide paste, a nitrogen atmosphere, a firing temperature of 300° C., a firing time of 10 minutes, and a pressurization pressure of 5 MPa were set.

In addition, as the silver oxide paste, a paste obtained by mixing a commercially available silver oxide powder (manufactured by Wako Pure Chemical industries, Ltd.), myristyl alcohol as a reducing agent, 2,2,4-trimethyl-1,3-pentanediol mono(2-methylpropanoate) as a solvent in fractions of the silver oxide powder; 80 mass %, the reducing agent (myristyl alcohol); 10 mass %, and the solvent (2,2,4-trimethyl-1,3-pentanediol mono(2-methylpropanoate)); a remainder was used.

In each comparative example, the glass-containing Ag paste described in the embodiment was applied to the surface of the circuit layer, dried, and then thermally treated at 550° C. for 10 minutes so as to form an Ag underlayer, thereby obtaining a substrate for an Ag underlayer-attached power module of the comparative example.

The amount of the glass-containing Ag paste applied is as shown in Table 1.

In addition, a silver oxide paste was applied (at a thickness applied of 10 μm) onto the Ag underlayer in the substrate for an Ag underlayer-attached power module of the comparative example, then, a semiconductor element was disposed, and the silver oxide paste was fired under the same conditions as in the invention examples so as to form a joint layer, thereby producing a semiconductor device of the comparative example.

(Area Proportion of Voids in Ag Layer Surface of Ag Underlayer)

In the invention examples and the comparative examples, the Ag layer surface of the formed Ag underlayer was observed using a laser microscope (VKX-200 manufactured by Keyence Corporation), the obtained image was binarized using software accompanied by the laser microscope, black portions were determined as voids, and the area proportion of the voids was obtained using the following expression.

Area proportion (%) of voids=(area of black portions (voids)/area of entire Ag underlayer)×100

Figure 10:
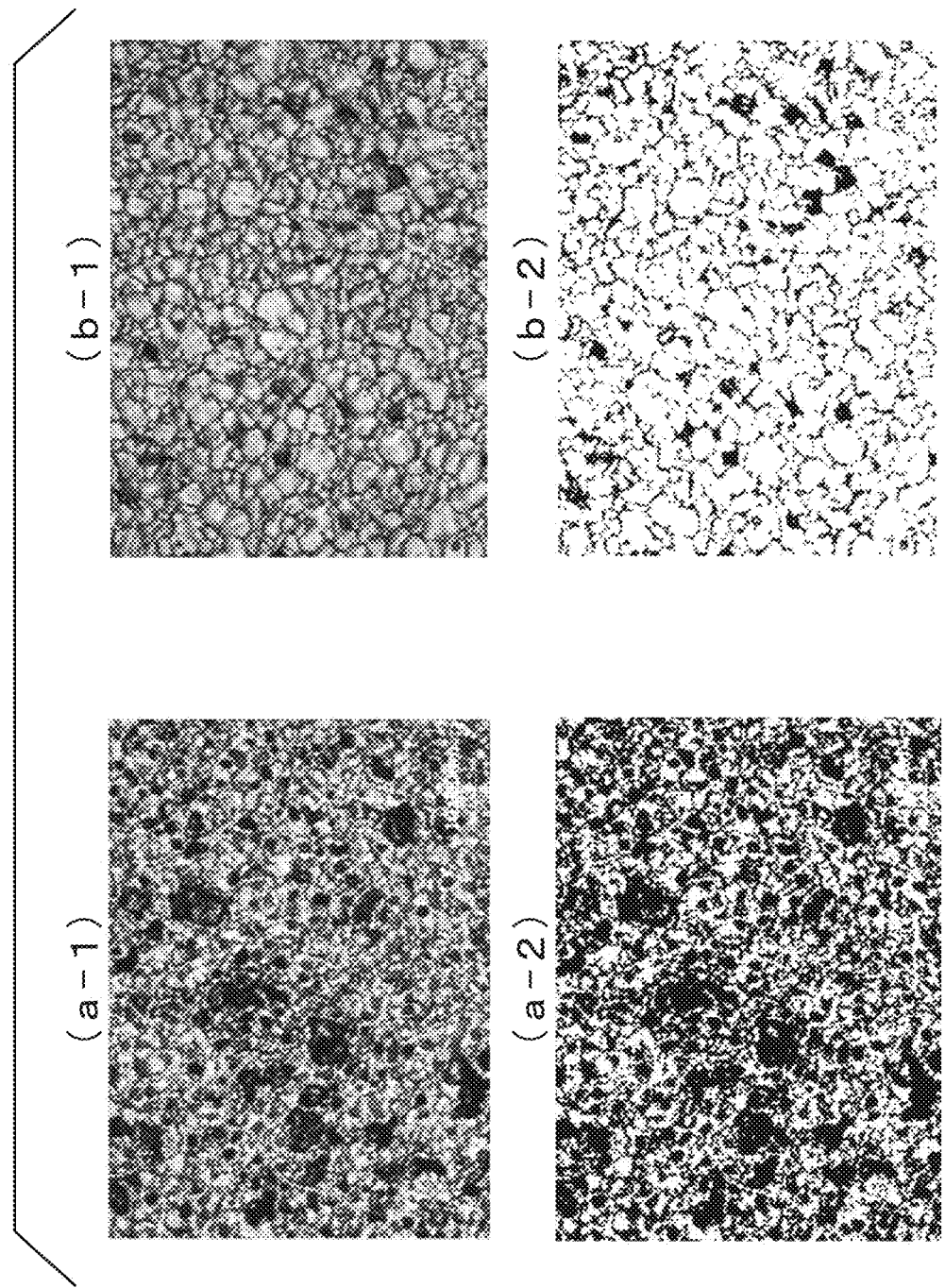
FIG. 10 illustrates observation photographs of Ag layer surfaces of Ag underlayers in invention examples and comparative examples.

Laser microscopic observation photographs of the Ag layer surfaces of the Ag underlayers in the invention examples and the comparative examples are illustrated in FIG. 10. FIG. 10(*a*-1) is an observation photograph of Comparative Example 1, FIG. 10(*a*-2) is a binarized image of FIG. 10(*a*-1), FIG. 10(*b*-1) is an observation photograph of Invention Example 3, and FIG. 10(*b*-2) is a binarized image of FIG. 10(*b*-1).

(Joining Percentage Before and after Thermal Cycle)

For the semiconductor devices of the invention examples and the comparative examples, the joining percentages between the semiconductor element and the circuit layer were obtained from the following expression using ultrasonic test equipment. Here, an initial joining area refers to an area to be joined before joining, that is, the area of the semiconductor element. Peeled portions in an ultrasonic test image are indicated by white portions in the joint portion, and thus the area of the white portions was considered as the peeled area.

(Joining percentage)=[{(initial joining area)−(peeled area)}/(initial joining area)]×100

A thermal cycle test was carried out on the semiconductor device in a gas phase, and the initial joining percentage and the joining percentage after the thermal cycle test were compared with each other. In the thermal cycle test, a cycle of −40° C.×15 minutes↔200° C.×15 minutes was repeated 3,000 times. The evaluation results are shown in Table 1.

TABLE 1

|  |  | Circuit layer | Amount of glass-containing Ag paste applied (μm) | Amount of Ag paste applied (μm) | Area proportion of voids in surface of Ag underlayer on Ag layer side (%) | Joining percentage (%) Initial | Joining percentage (%) After thermal cycle |
|---|---|---|---|---|---|---|---|
| Invention Example | 1 | 4N aluminum | 1 | 10 | 13 | 98 | 93 |
|  | 2 | 4N aluminum | 2 | 10 | 12 | 98 | 96 |
|  | 3 | 4N aluminum | 6 | 6 | 15 | 97 | 97 |
|  | 4 | 4N aluminum | 10 | 2 | 17 | 96 | 90 |
|  | 5 | 4N aluminum | 10 | 1 | 24 | 93 | 88 |
|  | 10 | Oxygen-free copper | 6 | 6 | 12 | 98 | 93 |
| Comparative Example | 1 | 4N aluminum | 10 | 0 | 45 | 95 | 43 |
|  | 2 | Oxygen-free copper | 10 | 0 | 50 | 91 | 15 |

* 4N aluminum: aluminum having a purity of 99.99 mass % or more

In the comparative examples in which the area proportion of voids in the surface of the Ag underlayer on the Ag layer side exceeded 25%, the joining percentage after the thermal cycle significantly decreased. This is assumed to be because, when a thermal cycle reaching a high temperature of 200° C. was loaded, cracks were generated from the voids in the surface of the Ag underlayer as origination points in the joint layer formed of the sintered body of the silver oxide paste.

In contrast, in the invention examples in which the area proportion of voids in the surface of the Ag underlayer on the Ag layer side was set to 25% or less, the joining percentage did not significantly change even after the thermal cycle.

What has been described above shows that, according to the invention examples, it is possible to provide an Ag underlayer-attached metallic member which is capable of suppressing the propagation of cracks in a joint layer even in the case of being used in a relatively high-temperature environment and can be strongly joined with a body to be joined.

REFERENCE SIGNS LIST 1, 101 POWER MODULE (SEMICONDUCTOR DEVICE)
3, 103 SEMICONDUCTOR ELEMENT
10, 110 SUBSTRATE FOR POWER MODULE (INSULATING CIRCUIT SUBSTRATE)
11, 111 CERAMIC SUBSTRATE (INSULATING LAYER)
12, 112, 212 CIRCUIT LAYER
30, 130a, 130b, 130c, 230 Ag UNDERLAYER
31 GLASS LAYER
32 Ag LAYER
50, 150 SUBSTRATE FOR Ag UNDERLAYER-ATTACHED POWER MODULE (Ag UNDERLAYER-ATTACHED INSULATING CIRCUIT SUBSTRATE)
113 METALLIC LAYER
160 SUBSTRATE FOR HEAT SINK-ATTACHED POWER MODULE (HEAT SINK-ATTACHED INSULATING CIRCUIT SUBSTRATE)
161 HEAT SINK

The invention claimed is:

1. An Ag underlayer-attached metallic member, comprising:
a metallic member joined with a body to be joined;
an Ag underlayer formed on a joining surface of the metallic member with the body to be joined, and
a joint layer formed on a surface of the Ag underlayer and provided between the body and the Ag underlayer,
wherein the Ag underlayer includes a glass layer formed on a metallic member side and an Ag layer laminated on the glass layer,
the joint layer is a sintered body of Ag,
crystalline particles containing at least one of Ag or Al are dispersed in the glass layer,
glass particles are dispersed in the Ag layer,
an area proportion of voids in a surface of the Ag underlayer on an Ag layer side is 25% or less,
the area proportion of voids is area of voids over the area of entire the surface of the Ag under layer on an Ag layer side, and
the Ag underlayer and the joint layer are formed by sintering simultaneously a dried glass-containing Ag paste and a dried Ag paste which does not contain any glass and is formed on the dried glass-containing Ag paste.

2. An Ag underlayer-attached insulating circuit substrate, comprising:
an insulating layer;
a circuit layer disposed on one surface of the insulating layer; and
an Ag underlayer formed on a surface of the circuit layer opposite to the insulating layer,
wherein the circuit layer and the Ag underlayer are formed of the metallic member and the Ag underlayer in the Ag underlayer-attached metallic member according to claim 1, and
an area proportion of voids in the surface of the Ag underlayer on the Ag layer side is set to 25% or less.

3. An Ag underlayer-attached insulating circuit substrate, comprising:
an insulating layer;
a circuit layer disposed on one surface of the insulating layer;
a metallic layer disposed on the other surface of the insulating layer; and
an Ag underlayer formed on a surface of the metallic layer opposite to the insulating layer, wherein the circuit layer and the Ag underlayer are formed of the metallic member and the Ag underlayer in the Ag underlayer-attached metallic member according to claim 1, and an area proportion of voids in the surface of the Ag underlayer on the Ag layer side is set to 25% or less.

4. A semiconductor device, comprising:

The Ag underlayer-attached insulating circuit substrate according to claim 2; and a semiconductor element joined to the Ag underlayer of the circuit layer, wherein the semiconductor element and the Ag underlayer are joined together through the joint layer formed of a sintered body of a joining material including either or both of Ag and silver oxide and an organic substance.

5. A heat sink-attached insulating circuit substrate, comprising:

the Ag underlayer-attached insulating circuit substrate according to claim 3; and a heat sink joined to the Ag underlayer of the metallic layer, wherein the heat sink and the Ag underlayer are joined together through a joint layer formed of a sintered body of a joining material including either or both of Ag and silver oxide and an organic substance.

6. A method for manufacturing the Ag underlayer-attached metallic member according to claim 1, the method comprising:

a glass-containing Ag paste application step of applying glass-containing Ag paste containing a glass component to a joining surface of the metallic member to which the body to be joined is joined;

a first drying step of drying the applied glass-containing Ag paste;

an Ag paste application step of applying Ag paste onto the dried glass-containing Ag paste;

a second drying step of drying the applied Ag paste; and a sintering step of sintering the dried glass-containing Ag paste and the dried Ag paste, thereby forming an Ag underlayer having a glass layer and an Ag layer and setting an area proportion of voids in an surface of the Ag underlayer on an Ag layer side to 25% or less.

* * * * *